US006900635B1

(12) United States Patent
Petropoulos et al.

(10) Patent No.: US 6,900,635 B1
(45) Date of Patent: May 31, 2005

(54) HEAD RF QUADRATURE COIL ARRAY FOR PARALLEL IMAGING

(75) Inventors: Labros S. Petropoulos, Solon, OH (US); Hiroyuki Fujita, Highland Heights, OH (US); Mark Xueming Zou, Aurora, OH (US); Yun-Jeong Yang, Streetsboro, OH (US); Dan K. Spence, Bryan, TX (US); Joseph Murphy-Boesch, Aurora, OH (US); Pei H. Chan, Aurora, OH (US); Dashen Chu, Hudson, OH (US)

(73) Assignee: General Electric Company, Schenectady, NY (US)

( * ) Notice: Subject to any disclaimer, the term of this patent is extended or adjusted under 35 U.S.C. 154(b) by 107 days.

(21) Appl. No.: 10/320,997

(22) Filed: Dec. 17, 2002

Related U.S. Application Data

(63) Continuation-in-part of application No. 10/187,353, filed on Jun. 28, 2002, which is a continuation-in-part of application No. 10/164,664, filed on Jun. 7, 2002.
(60) Provisional application No. 60/341,468, filed on Dec. 17, 2001, provisional application No. 60/302,158, filed on Jun. 29, 2001, and provisional application No. 60/296,885, filed on Jun. 8, 2001.

(51) Int. Cl.[7] ............................................... G01V 3/00
(52) U.S. Cl. ..................................... 324/318; 324/309
(58) Field of Search ............................. 324/318, 319, 324/322, 309, 307; 600/410

(56) References Cited

U.S. PATENT DOCUMENTS

| | | | |
|---|---|---|---|
| 4,825,162 A | 4/1989 | Roemer et al. | ............. 324/318 |
| 5,198,768 A | 3/1993 | Keren | ........................ 324/318 |

(Continued)

OTHER PUBLICATIONS

"Simultaneous Acquisition of Spatial Harmonics (SMASH): Fast Imagingwith Radiofrequency Coil Arrays," Daniel K. Sodickson and Warren J. Manning, Magnetic Resonance in Medicine 38:591–603 (1997).
"SENSE: Sensitivity Encoding for Fast MRI," Klaas P. Pruessmann, et al., Magnetic Resonance in Medicine 42:952–962 (1999).
"A multicoil array designed for cardiac SMASH imaging," Mark A. Griswold, et al., Magnetic Resonance Materials in Physics, Biology and Medicine 10 (2000) 105–113.
"SMASH imaging with an eight element multiplexed RF coil array," James A. Bankson, et al., Magnetic Resonance Materials in Physics, Biology and Medicine 10 (2000) 93–104.
"An array that exploits phase for SENSE imaging," Joseph V. Hajnal, et al., International Society for Magnetic Resonance in Medicine, 8th Scientific Meeting & Exhibition, Proceedings, 1719, (2000).
"A 4 channel head coil for SENSE imaging," D. J. Herlihy, et al., International Society for Magnetic Resonance in Medicine, 8th Scientific Meeting & Exhibition, Proceedings, 1394, (2000).
"Planar Strip Array (PSA) for MRI" Ray F. Lee, et al., Magnetic Resonance in Medicine 45:673–683 (2001).

(Continued)

*Primary Examiner*—Brij B. Shrivastav
(74) *Attorney, Agent, or Firm*—Michael A. Della Penna; Armstrong Teasdale, LLP

(57) ABSTRACT

A partially parallel acquisition RF coil array for imaging a human head having a summit and a lower portion includes at least a first, a second and a third quadrature coil pair adapted to be arranged circumambiently about the lower portion of the head; and at least a forth, a fifth and a sixth quadrature coil pair adapted to be conformably arranged about the summit of the head.

20 Claims, 5 Drawing Sheets

U.S. PATENT DOCUMENTS

| | | | | |
|---|---|---|---|---|
| 5,430,378 | A | | 7/1995 | Jones ........................ 324/318 |
| 5,477,146 | A | | 12/1995 | Jones ........................ 324/318 |
| 5,548,218 | A | | 8/1996 | Lu .............................. 324/318 |
| 5,910,728 | A | | 6/1999 | Sodickson ................... 324/318 |
| 6,150,816 | A | * | 11/2000 | Srinivasan ................... 324/318 |
| 6,169,401 | B1 | | 1/2001 | Fujita et al. ................. 324/318 |
| 6,177,797 | B1 | * | 1/2001 | Srinivasan ................... 324/318 |
| 6,236,203 | B1 | | 5/2001 | Shvartsman et al. ......... 324/318 |
| 6,323,648 | B1 | * | 11/2001 | Belt et al. .................... 324/322 |
| 6,469,505 | B1 | * | 10/2002 | Maier et al. ................. 324/309 |
| 6,476,606 | B2 | * | 11/2002 | Lee .............................. 324/309 |
| 6,597,173 | B1 | * | 7/2003 | Bernstein ..................... 324/318 |
| 6,624,633 | B1 | * | 9/2003 | Zou et al. .................... 324/318 |
| 6,666,055 | B2 | * | 12/2003 | Janicek ........................ 70/278.1 |
| 6,680,610 | B1 | * | 1/2004 | Kyriakos et al. ............ 324/307 |

OTHER PUBLICATIONS

"Concentric Coil Arrays for Spatial Encoding in Parallel MRI," Michael A. Ohliger, et al., International Society for Magnetic Resonance in Medicine, 9$^{th}$ Scientific Meeting & Exhibition, Proceedings, 21, (2001).

"Specific Coil Design for SENSE: A Six–Element Cardiac Array," Markus Weiger, et al., Magnetic Resonance in Medicine 45:495–504 (2001).

"SMASH and SENSE: Experimental and Numerical Comparisons," Bruno Madore and Norbert J. Pelc, Magnetic Resonance in Medicine 45:1103–1111 (2001).

"An efficient, highly homogeneous radiofrequency coil for whole–body NMR imagining at 1.5T," Cecil E. Hayes, et al., Journal of Magnetic Resonance 63:622–628 (1985).

"A Four Channel Transceive Phased Array Head Coil for 3T," Scott B. King et al., International Society for Magnetic Resonance in Medicine, 9$^{th}$ Scientific Meeting & Exhibition, Proceedings, 12, (2001).

* cited by examiner

HEAD RF QUADRATURE COIL ARRAY FOR PARALLEL IMAGING

CROSS-REFERENCE TO RELATED APPLICATIONS

This application claims the benefit of the following U.S. provisional patent applications: Ser. No. 60/341,468 filed Dec. 17, 2001; Ser. No. 60/302,158 filed Jun. 29, 2001; and Ser. No. 60/296,885 filed Jun. 8, 2001.

This application is a continuation-in-part of U.S. utility patent application Ser. No. 10/187,353 filed Jun. 28, 2002, which application is a continuation-in-part of U.S. utility patent application Ser. No. 10/164,664 filed Jun. 7, 2002.

BACKGROUND OF THE INVENTION

The present invention relates to magnetic resonance imaging (MRI) systems, and particularly to the radio frequency (RF) coils used in such systems.

Magnetic resonance imaging (MRI) utilizes hydrogen nuclear spins of the water molecules in the human body or other tissue, which are polarized by a strong, uniform, static magnetic field generated by a magnet (referred to as B0 —the main magnetic field in MRI physics). The magnetically polarized nuclear spins generate magnetic moments in the human body. The magnetic moments point in the direction of the main magnetic field in a steady state, and produce no useful information if they are not disturbed by any excitation.

The generation of nuclear magnetic resonance (NMR) signal for MRI data acquisition is achieved by exciting the magnetic moments with a uniform radio frequency (RF) magnetic field (referred to as the B1 field or the excitation field). The B1 field is produced in the imaging region of interest by an RF transmit coil which is driven by a computer-controlled RF transmitter with a power amplifier. During the excitation, the nuclear spin system absorbs magnetic energy, and its magnetic moments precess around the direction of the main magnetic field. After the excitation, the precessing magnetic moments will go through a process of free induction decay, emitting their absorbed energy and then returning to the steady state. During the free induction decay, NMR signals are detected by the use of a receive RF coil, which is placed in the vicinity of the excited volume of the human body. The NMR signal is an induced electrical motive force (voltage), or current, in the receive RF coil that has been induced by the flux change over some time period due to the relaxation of precessing magnetic moments in the human tissue. This signal provides the contrast information of the image. The receive RF coil can be either the transmit coil itself, or an independent receive-only RF coil. The NMR signal is used for producing magnetic resonance images by using additional pulsed magnetic gradient fields, which are generated by gradient coils integrated inside the main magnet system. The gradient fields are used to spatially encode the signals and selectively excite a specific volume of the human body. There are usually three sets of gradient coils in a standard MRI system, which generate magnetic fields in the same direction of the main magnetic field, varying linearly in the imaging volume.

In MRI, it is desirable for the excitation and reception to be spatially uniform in the imaging volume for better image uniformity. In a standard MRI system, the best excitation field homogeneity is usually obtained by using a whole-body volume RF coil for transmission. The whole-body transmit coil is the largest RF coil in the system. A large coil, however, produces lower signal-to-noise ratio (S/N) if it is also used for reception, mainly because of its greater distance from the signal-generating tissues being imaged. Since a high signal-to-noise ratio is the most desirable factor in MRI, special-purpose coils are used for reception to enhance the S/N ratio from the volume of interest.

In practice, a well-designed specialty RF coil should have the following functional properties: high S/N ratio, good uniformity, high unloaded quality factor (O) of the resonance circuit, and high ratio of the unloaded to loaded Q factors. In addition, the coil device must be mechanically designed to facilitate patient handling and comfort, and to provide a protective barrier between the patient and the RF electronics. Another way to increase the S/N is by quadrature reception. In this method, NMR signals are detected in two orthogonal directions, which are in the transverse plane or perpendicular to the main magnetic field. The two signals are detected by two independent individual coils which cover the same volume of interest. With quadrature reception, the S/N can be increased by up to $\sqrt{2}$ over that of the individual linear coils.

To cover a large field-of-view, while maintaining the S/N characteristic of a small and conformal coil, a linear surface coil array technique was created to image the entire human spines (U.S. Pat. No. 4,825,162). Subsequently, other linear surface array coils were used for C.L. spine imaging, such as the technique described in U.S. Pat. No. 5,198,768. These two devices consist of an array of planar linear surface coil elements. These coil systems do not work well for imaging deep tissues, such as the blood vessels in the lower abdomen, due to sensitivity drop-off away from the coil surface.

To image the lower extremities, quadrature phased array coils have been utilized such as described in U.S. Pat. Nos. 5,430,378 and 5,548,218. The first quadrature phased array coil, images the lower extremities by using two orthogonal linear coil arrays: six planar loop coil elements placed in the horizontal plane and underneath the patient and six planar loop coil elements placed in the vertical plane and in between the legs. Each linear coil array functions in a similar way as described in U.S. Pat. No. 4,825,162 (Roemer). The second quadrature phased array coil (Lu) was designed to image the blood vessels from the pelvis down. This device also consists of two orthogonal linear coil arrays extending in the head-to-toe direction: a planar array of loop coil elements laterally centrally located on top of the second array of butterfly coil elements. The loop coils are placed immediately underneath the patient and the butterfly coils are wrapped around the patient. Again, each linear coil array functions in a similar way as described in U.S. Pat. No. 4,825,162.

In MRI, gradient coils are routinely used to give phase-encoding information to a sample to be imaged. To obtain an image, it is required that all the data points in a so-called "k-space" (i.e., frequency space) must be collected. Recently, there have been developments where some of the data points in k-space are intentionally skipped and at the same time use the intrinsic sensitivity information of RF receive coils as the phase-encoding information for those skipped data points. This action takes place simultaneously, and thus is referred to as partially parallel imaging or partially parallel acquisition (PPA). By collecting multiple data points simultaneously, it requires less time to acquire the same amount of data, when compared with the conventional gradient-only phase-encoding approach. The time savings can be used to reduce total imaging time, in particular, for the applications in which cardiac or respiratory motions in tissues being imaged become concerns, or to collect more data to achieve better resolution or S/N. SiMultaneous Acquisition of Spatial Harmonics, SMASH, (U.S. Pat. No. 5,910,728 and "Simultaneous Acquisition of Spatial Harmonics (SMASH): Fast Imaging with Radiofrequency Coil Arrays," Daniel K. Sodickson and Warren J. Manning, Magnetic Resonance in Medicine 38:591–603 (1997), both incorporated herein by reference) and "SENSE: Sensitivity Encoding for Fast MRI," Klaas P. Pruessmann, et al., Magnetic Resonance in Medicine 42:952–962 (1999, also incorporated by reference, are basically two methods of PPA. SMASH takes advantage of the parallel imaging by skipping phase encode lines that yield decreasing the Field-of-View (FOV) in the phase-encoding direction and uses coils (e.g., coil arrays) together with reconstruction techniques to fill in the missing data points in k-space. SENSE, on the other hand, is a technique that utilizes a reduced FOV in the read direction, resulting an aliased image that is then unfolded in x-space (i.e., real space), while using the RF coil sensitivity information, to obtain a true corresponding image. Here, we make use of phase difference between signals from multiple coils to skip phase encoding steps. By skipping some of the phase encoding steps, one can achieve speeding up imaging process by a reduction factor R. Theoretically speaking, the factor R should equal the number of independent coils/arrays. In the SENSE approach, the S/R is defined as:

$$SNRSENSE = SNRFULL/\{g\sqrt{R}\}$$

where SNRFULL is the S/N achievable when all the phase encoding steps are collected by traditional gradient phase encoding scheme. SNRSENSE is optimized when the geometry factor g equals 1. To obtain g of 1, traditional decoupling techniques such as overlapping nearest neighbor elements to null the mutual inductance between them shall not apply, as have been reported by others.

SENSE and SMASH or a hybrid approach of both demand a new type of design requirements in RF coil design. In SMASH, the primary criterion for the array is that it be capable of generating sinusoids whose wavelengths are on the order of the FOV. This is how the target FOV along the phase encoding direction for the array is determined. Conventional array designs can incorporate element and array dimensions that will give optimal S/N for the object of interest. In addition, users of conventional arrays are free to choose practically any FOV, as long as severe aliasing artifacts are not a problem. In contrast, when using SMASH, the size of the array determines the approximate range of FOVs that can be used in the imaging experiment. This then determines the approximate element dimensions, assuming complete coverage of the FOV is desired, as in most cases. In SENSE, the method is based upon the fact that the sensitivity of a RF receiver coil generally has a phase-encoding effect complementary to those achieved by linear field gradients. For SENSE imaging, the elements of a coil array should be smaller than for common phased-array imaging, resulting in a trade-off between basic noise and geometry factor, and adjacent coil elements should not overlap for a net gain in S/N due to the improved geometry factor when using SENSE.

For PPA applications, different types of RF coils or arrays have been used so far. However, most of them are based upon "traditional" RF coil design requirements, thus remain within the conventional coil design scheme. It has been reported, however, that since the phase information of B1 of a receive coil is very important when SENSE applications are demanded, for example, new coil design techniques such as non-overlapping adjacent coil elements may be necessary for better definition of the individual phase information associated with each RF coil used in an array, unlike traditional design scheme where two adjacent coils elements are overlapped to null the mutual inductance between the elements (U.S. Pat. No. 4,825,162). Without overlap, the coupling may be increased, but there is a net gain in S/N due to the improved geometry factor when using SENSE. As stated in the above, the use of smaller coil-elements than those for conventional imaging results in a trade-off between basic noise and geometry factor.

SUMMARY OF THE INVENTION

A partially parallel acquisition RF coil array for imaging a human head having a summit and a lower portion includes at least a first, a second and a third quadrature coil pair adapted to be arranged circumambiently about the lower portion of the head; and at least a forth, a fifth and a sixth quadrature coil pair adapted to be conformably arranged about the summit of the head.

DESCRIPTION OF THE PREFERRED EMBODIMENTS

Figure 1:
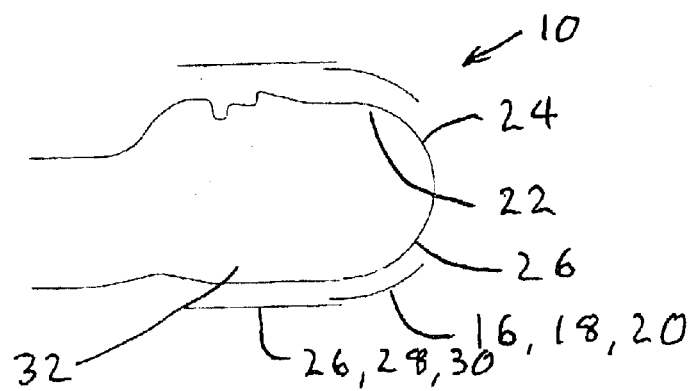
FIG. 1 is a side elevation view of a schematic diagram of an exemplary head coil array according to an embodiment of the invention
Figure 2:
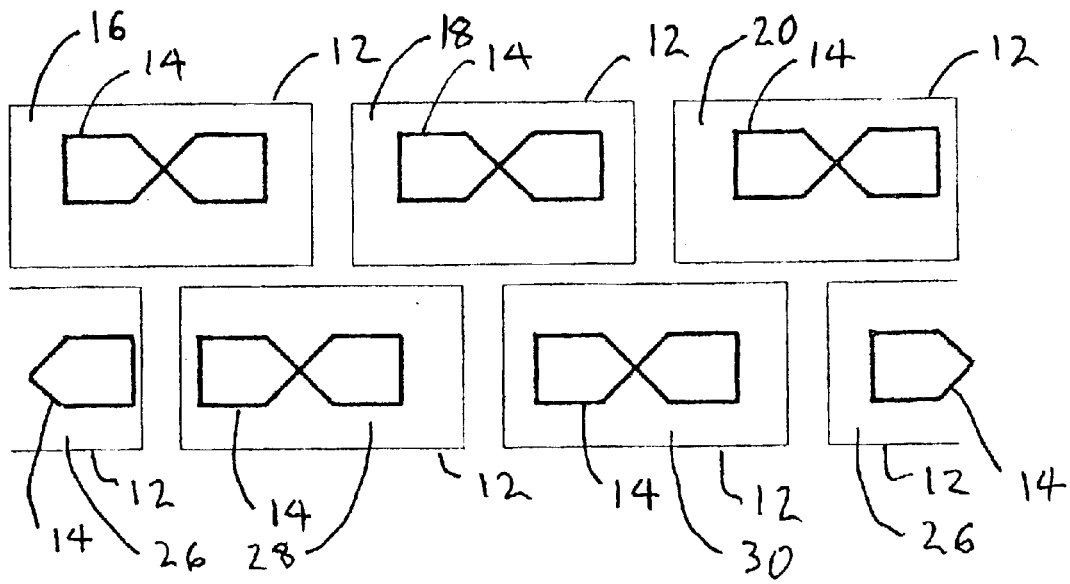
FIG. 2 is a schematic view of the coil array of FIG. 1 unwrapped on a plane.

Referring to FIGS. 1 and 2, a 12-element dome phased head RF coil array 10 suitable for 3.0 Tesla systems is disclosed. The array 10 is configured as a 6-channel quadrature pair design and it is such that the structure can be utilized for conventional, as well as parallel imaging applications. There is a distinct advantage of the 12-element coil design over a conventional 6 loop design in terms of achieving higher acceleration speeds with lower g-factors and higher SNR. Although the present design is specifically targeted for a six channel receive system, it can be expanded to more that 6 channels or more than 12 elements depending the availability of the receive chain of the specific MRI system. For example, for those skilled in the art, 8 or 10 quadrature pairs that correspond to 16 or 20 individual elements is also a feasible design depending on the target head application.

Referring to FIGS. 1 and 2, the 12-element array formed from the six loop coils 12 and six saddle coils 14 in quadrature pairs. Three loop-saddle coil pairs 16, 18, 20 are wrapped around the upper part 22 of the head 24 while conforming to the summit of the head 26 (i.e., a dome-like structure) for improving S/N. Another three loop-saddle coil pairs 26, 28, 30 are circumambiently wrapped around the lower part 32 of the head 24. This results in a six-channel PPA coil array.

FIG. 2 shows the coil array 10 projected on a plane (it should be understood that the left and right sides are actually joined to form a cylindrical/domed structure). The coil pairs 16, 18, 20 are staggered sixty degrees with respect to the coil pairs 26, 28, 30.

Figure 3:
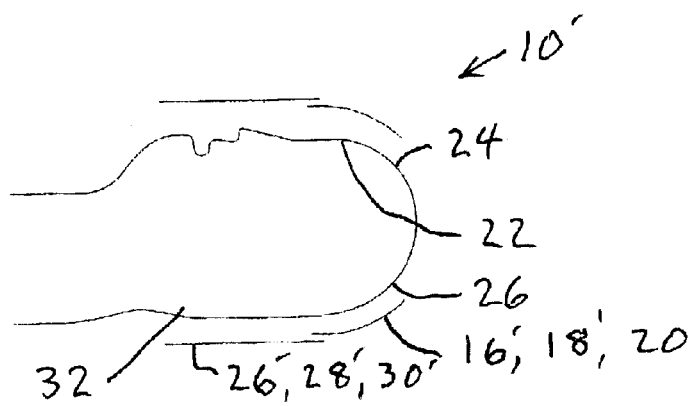
FIG. 3 is a side elevation view of a schematic diagram of an another embodiment of an exemplary head coil according to the invention.
Figure 4:
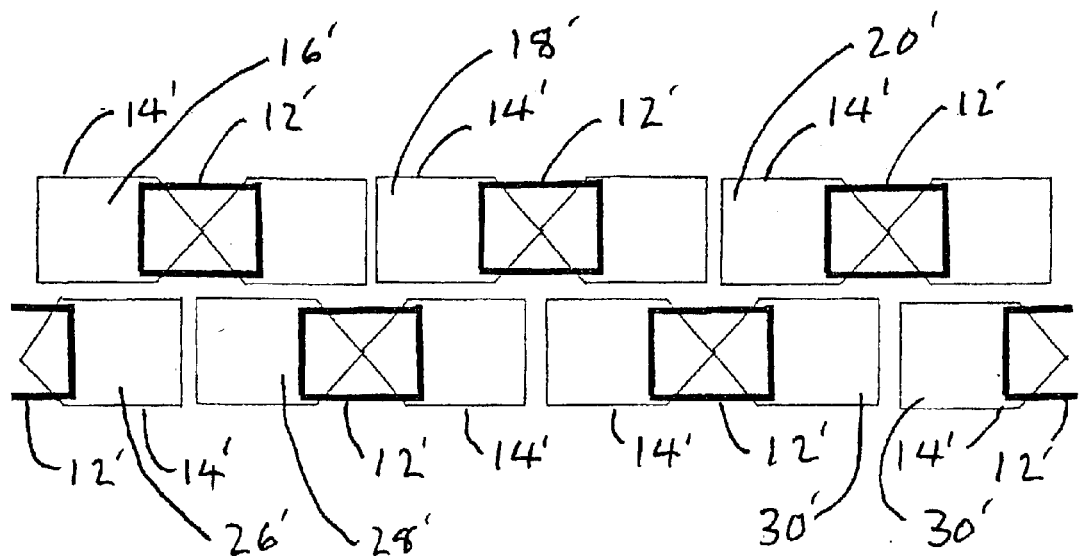
FIG. 4 is a schematic view of the coil array of FIG. 3 unwrapped on a plane.
Figure 5:
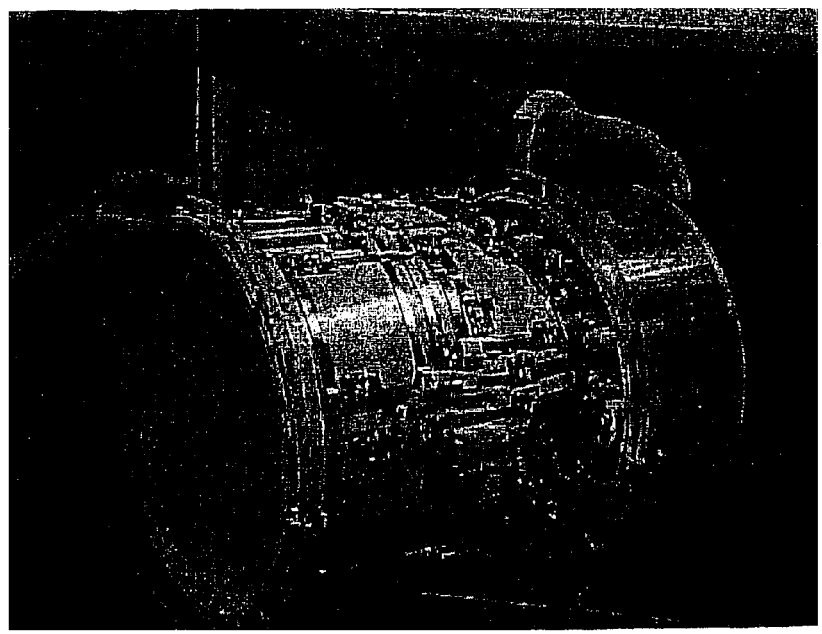
FIG. 5 is a perspective view of a coil array according to an embodiment of the invention.

The coil pairs of FIG. 2 have large loop coils 12 with respect to the saddle coils 14. Referring to FIGS. 3 and 4, it is also possible to have small loop coils 12' with respect to the saddle coils 14'. The sizes of the loop coils and saddle coils can be changed based on the desired application.

A configuration where adjacent coils are not overlapped is shown, and overlapping is not necessary when a low-input impedance amplifier decoupling technique is employed, for instance. In parallel imaging modality, the elements of a coil array should be smaller than for common phased-array imaging., resulting in a trade-off between the basic noise and geometry factor. The non-overlapping configuration may yield a net gain in S/N due to the improved geometry factor when using SENSE.

Figure 6:
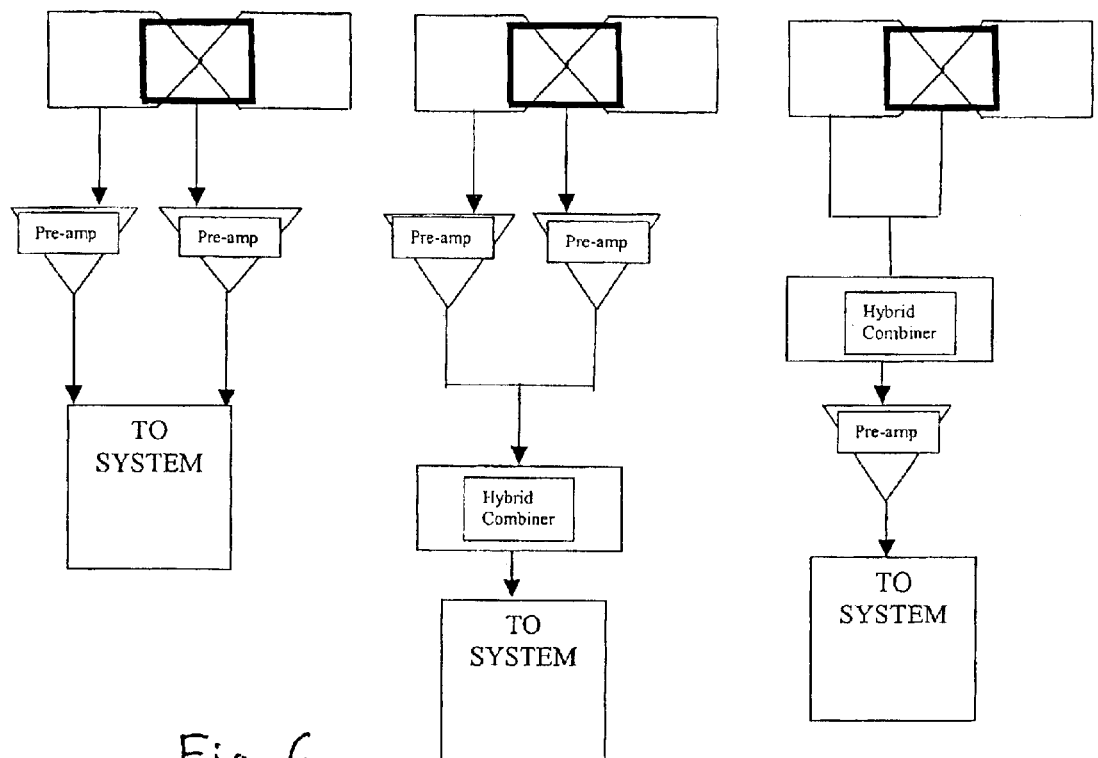
FIG. 6 is representative block diagrams of coil MRI system connections according to embodiments of the invention.
Figure 7:
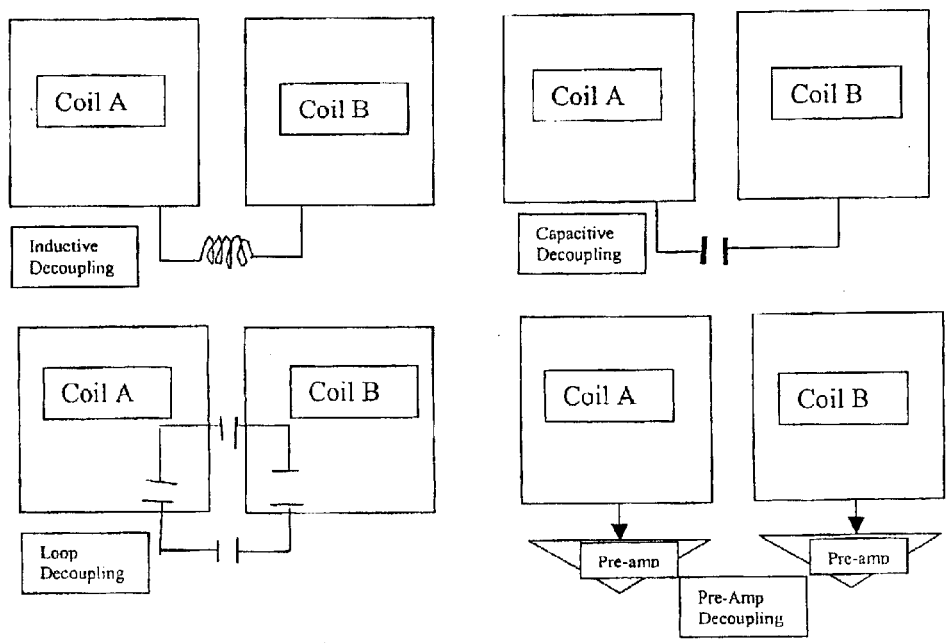
FIG. 7 is representative block diagrams of coil decoupling schemes according to embodiments of the invention.

An exemplary physical embodiment of the array coil 10 is shown in FIG. 6. This coil array is 27 cm and an overall electrical length is equal to 24.5 cm. The coil was constructed on an ABS former using 12.5 mm wide copper tape. The separation between the adjacent loops was chosen to be 1.0 cm, while the separation between the saddles, which are enclosed inside the area of the loops was chosen to be 2.0 cm. The coil is tuned to 127.7 MHz. Each loop and saddle pair were matched to 50 Ohms. Matching, using a phantom load was −25 dB or better for either coil; while matching on a human subject was −22 dB or better. Quadrature detection isolation between the coils was −23 dB or while the isolation between adjacent pairs of coils was −21 dB or better considering pre-amp decoupling.

Figure 8:
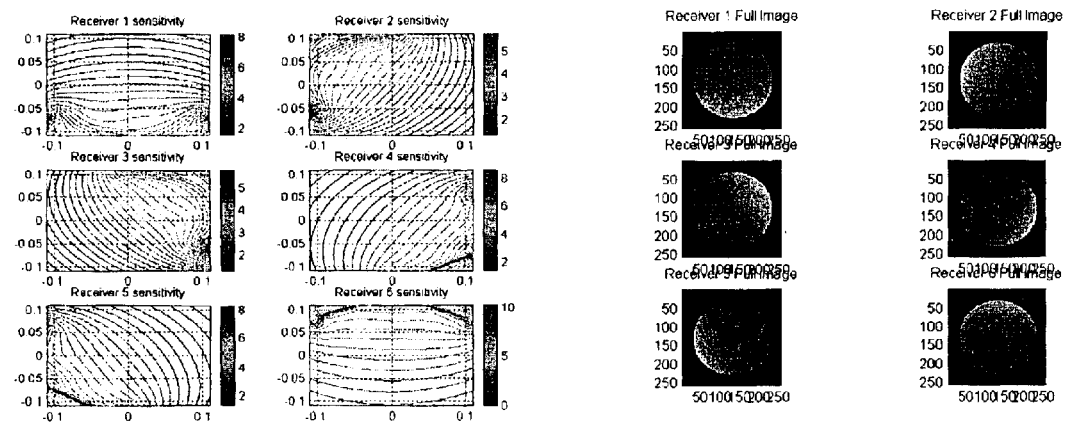
FIG. 8 graphically depicts the B1 profiles for an exemplary coil array according to an embodiment of the invention.
Figures 9A, 9B, 9C:
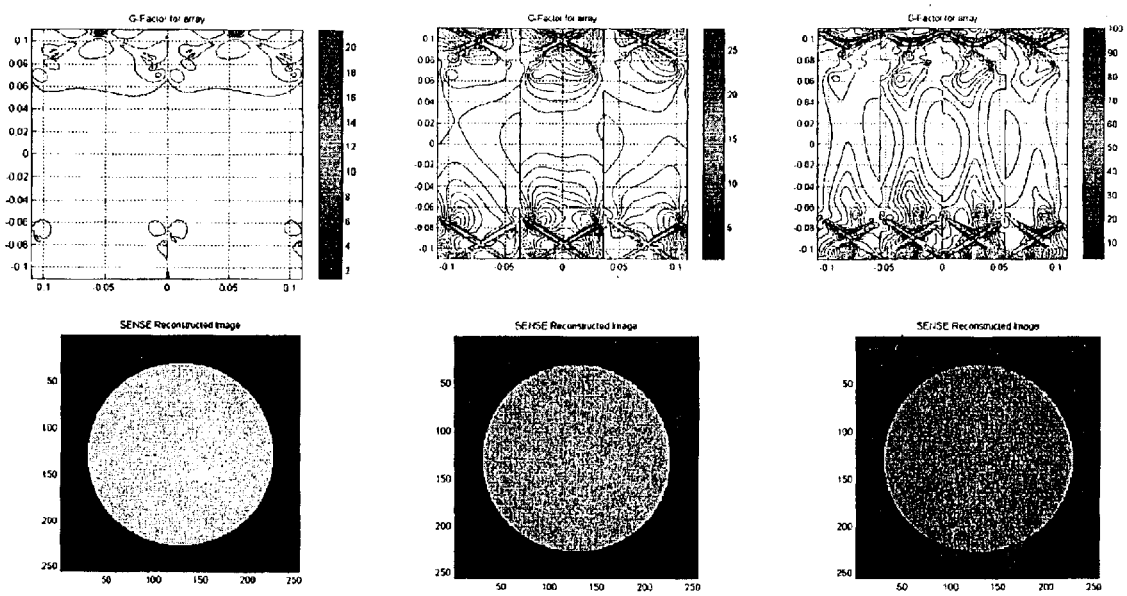
FIG. 9 graphically depicts the G-factor and image profiles for an exemplary coil array according to an embodiment of the invention.

Numerical simulations of the B1 sensitivity profiles for the six quadrature pairs are shown in FIG. 8. Furthermore, FIGS. 9a, 9b, and 9c illustrate the g-factor and numerically reconstructed images with acceleration speeds of 2, 3 and 4 for the 12-element coil array. It is noticeable that even for an acceleration factor of 3, the g-factor of the coil structure is low enough to allow image reconstruction with no significant noise regions.

Figure 10:
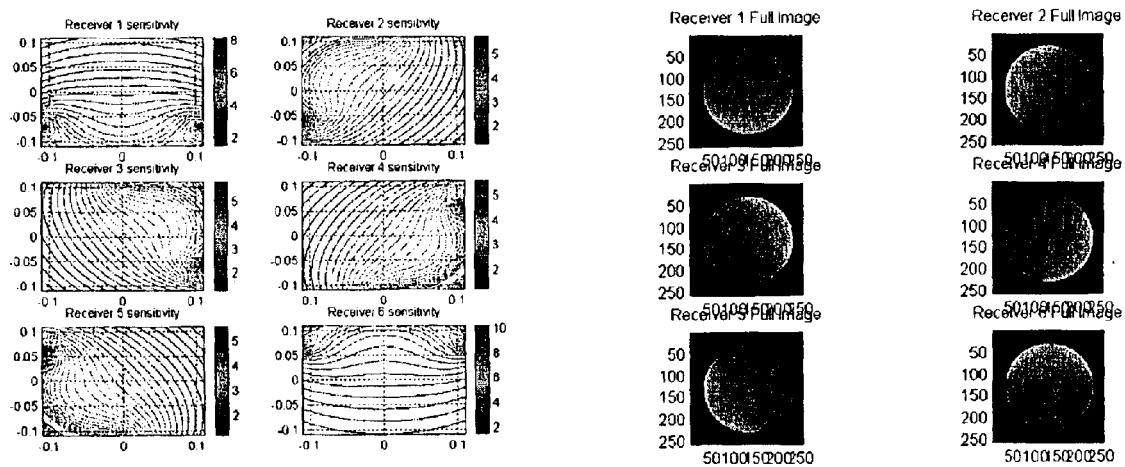
FIG. 10 graphically depicts the B1 profiles of a 6-loop dome head coil for parallel acquisition.
Figure 11A:
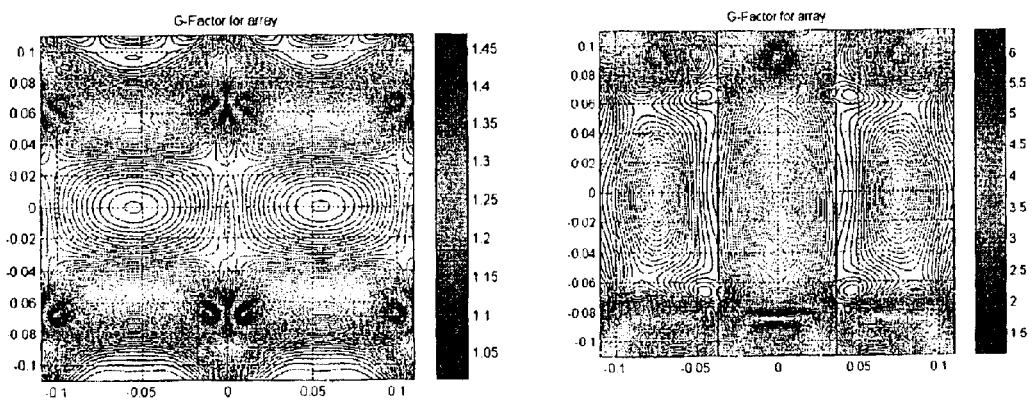
FIG. 11 graphically depicts the G-factor and image profiles of a 6-loop dome head coil for parallel acquisition.
Figure 11A:
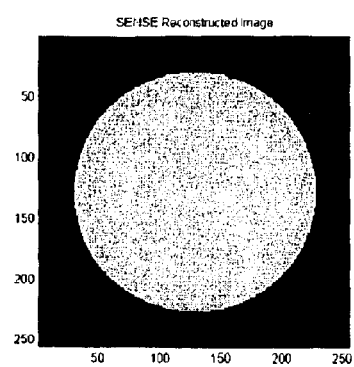
Figure 11B:
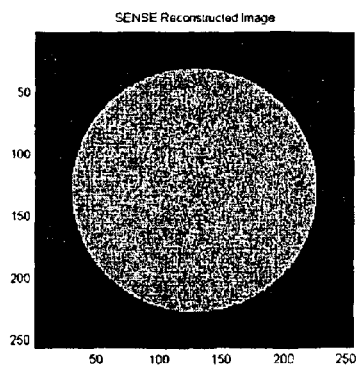

The 12-element coil array embodiment was compared against a 6-loop head coil array design with similar physical dimensions in terms of acceleration and g-factor capabilities. FIG. 10 illustrates the B1 field pattern for the six linear loop dome head coil array design. In addition, FIGS. 11 and 11b illustrate the g-factor profiles and the simulated image reconstruction for the six loop coil design with acceleration speeds of 2 and 3, respectively. It is noticeable for accelerations speeds equal to 3 (FIG. 11b), the g-factor for the 6-loop dome design is excessively high and thus high noise regions appeared at the center of the image. This is not the case for the 12-element 6 quadrature pair dome coil design as it is shown in FIG. 9b. Furthermore, due to its quadrature detection nature, the 12-element dome design generates a higher sensitivity B1 field than a comparable-in-size six linear loop-design.

While a generally cylindrical array coil is shown, it is also possible, for example, to use an elliptically shaped cross sections in the radial direction. a cubical or any conceivable shape for the array, for both horizontally and vertically directed fields.

Also, for example, the coil array can be constructed in a clam-shell, split-top or solid configurations, or it can be split into more than two pieces depending on the demanded application. The coil can also be open to accept various optical and acoustical devices. The 12-element 6-quadrature pair head coil array can be a stand-alone configuration as a transmit, transmit/receive, or receive device, or can be part of the phased array or other configuration which may involve RF resonators for either horizontally or vertically directed main magnetic fields. The 12-element 6-quadrature pair coil array configuration can be used as a dual frequency resonator.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A partially parallel acquisition RF coil array for imaging a human head having a summit and a lower portion, said array comprising: at least a first, a second and a third quadrature coil pair adapted to be arranged circumambiently about said lower portion of said head; and at least a fourth, a fifth and a sixth quadrature coil pair adapted to be conformably arranged about said summit of said head.

2. An array according to claim 1, wherein said first, said second and said third coil pairs are staggered by 60 degrees with respect to said fourth, said fifth and said sixth coil pairs.

3. An array according to claim 1, wherein said quadrature coil pairs are formed from a loop coil and a coil having a magnetic sensitivity orthogonal to said loop coil.

4. An array according to claim 1, wherein said quadrature coil pairs are formed from a loop coil and a saddle coil.

5. An array according to claim 4, wherein said loop coils are larger than said saddle coils.

6. An array according to claim 4, wherein said loop coils are smaller than said saddle coils.

7. An array according to claim 1, wherein said first, second and third quadrature coil pairs are configured in a cylindrical arrangement.

8. An array according to claim 1, wherein said first, second and third quadrature coil pairs are configured in an elliptical arrangement.

9. An array according to claim 1, wherein said first, second and third quadrature coil pairs are configured in a cubical arrangement.

10. An array according to claim 4, wherein said loop coils are configured to overlap with adjacent saddle coils.

11. An array according to claim 4, wherein said loops coils are configured in a non-overlapping arrangement with said saddle coils.

12. An array according to claim 1, wherein said quadrature coil pairs are arranged in one of a clam-shell, split-top and solid configuration.

13. An array according to claim 1, wherein said quadrature coil pairs are provided in at least two pieces.

14. An array according to claim 1, wherein said quadrature coil pairs comprise at least one of a transmit, a transmit/receive and a receive coil pair.

15. An array according to claim 1, wherein said quadrature coil pairs are configured to operate in connection with a phased array in one of a horizontal and vertical magnetic field system.

16. An array according to claim 1, wherein said quadrature coil pairs are configured to operate as a dual frequency resonator.

17. A RF head coil array comprising:
   a first plurality of quadrature coil pairs configured to be arranged circumambiently about a lower portion of a head; and
   a second plurality of quadrature coil pairs configured to be arranged conformably about a summit of the head.

18. A RF head coil array according to claim 17, wherein said quadrature coil pairs are formed from a loop coil and a saddle coil.

19. A RF head coil array according to claim 17, wherein said second plurality of quadrature coil pairs are configured in a dome-shaped arrangement.

20. A method for parallel imaging comprising:
   configuring a first plurality of quadrature coil pairs in a circumambient arrangement about a lower portion of a head; and
   configuring a second plurality of quadrature coil pairs in a conformal arrangement about a summit of said head.

* * * * *